United States Patent
Miyazawa

(10) Patent No.: US 12,243,763 B2
(45) Date of Patent: Mar. 4, 2025

(54) SUBSTRATE FIXING DEVICE AND ELECTROSTATIC CHUCK

(71) Applicant: SHINKO ELECTRIC INDUSTRIES CO., LTD., Nagano (JP)

(72) Inventor: Masakuni Miyazawa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 986 days.

(21) Appl. No.: 17/010,149

(22) Filed: Sep. 2, 2020

(65) Prior Publication Data
US 2021/0082731 A1    Mar. 18, 2021

(30) Foreign Application Priority Data

Sep. 18, 2019  (JP) .................................. 2019-169649

(51) Int. Cl.
H01L 21/683    (2006.01)
H01L 21/67     (2006.01)
H01L 21/687    (2006.01)

(52) U.S. Cl.
CPC .... *H01L 21/6833* (2013.01); *H01L 21/67109* (2013.01); *H01L 21/68757* (2013.01); *H01L 21/68785* (2013.01)

(58) Field of Classification Search
CPC ....................... H01L 21/67109; H01L 21/6833
See application file for complete search history.

(56) References Cited

U.S. PATENT DOCUMENTS

| | | | | |
|---|---|---|---|---|
| 5,720,818 | A  * | 2/1998 | Donde | C23C 16/4586 118/728 |
| 6,490,145 | B1 * | 12/2002 | Kholodenko | H01L 21/6833 361/234 |
| 9,627,240 | B2 | 4/2017 | Yamaguchi et al. | |

(Continued)

FOREIGN PATENT DOCUMENTS

| | | |
|---|---|---|
| CN | 105074901 | 11/2015 |
| CN | 109219873 | 1/2019 |

(Continued)

OTHER PUBLICATIONS

Office Action mailed on Sep. 10, 2024 with respect to the corresponding Korean application No. 10-2020-0116594.

(Continued)

*Primary Examiner* — Eric A. Gates
(74) *Attorney, Agent, or Firm* — IPUSA, PLLC

(57) ABSTRACT

A substrate fixing device includes an electrostatic chuck on a baseplate, and a porous body in a gas hole piercing through a substrate of the electrostatic chuck. The electrostatic chuck attracts an object onto a first surface of the substrate. The gas hole includes a first recess formed in a second surface of the substrate facing the baseplate and depressed toward the first surface, a second recess formed at the bottom of the first recess and depressed toward the first surface, and a through hole extending from the bottom of the second recess to the first surface. The first recess is entirely and the second recess is partly filled with the porous body. A region of the second recess unfilled with the porous body is a recess in the porous body depressed toward the second surface relative to where the bottom of the second recess communicates with the through hole.

16 Claims, 6 Drawing Sheets

(56) References Cited

U.S. PATENT DOCUMENTS

| | | | |
|---|---|---|---|
| 9,960,067 B2* | 5/2018 | Anada | H01L 21/67109 |
| 10,688,750 B2* | 6/2020 | Parkhe | B32B 5/18 |
| 10,770,270 B2 | 9/2020 | Cho et al. | |
| 10,998,216 B2 | 5/2021 | Horiuchi et al. | |
| 11,417,556 B2* | 8/2022 | Shiraishi | C23C 16/4581 |
| 11,626,310 B2* | 4/2023 | Shiraishi | H01L 21/68785 |
| | | | 324/234 |
| 2016/0276198 A1 | 9/2016 | Anada et al. | |
| 2017/0352568 A1* | 12/2017 | Cho | H01L 21/6831 |
| 2017/0358476 A1* | 12/2017 | Horiuchi | C04B 41/91 |
| 2018/0240688 A1* | 8/2018 | Hao | H01L 21/67109 |
| 2019/0252231 A1 | 8/2019 | Takasaki | |

FOREIGN PATENT DOCUMENTS

| | | | |
|---|---|---|---|
| JP | 2013-232641 | 11/2013 | |
| JP | 2015-195346 | 11/2015 | |
| KR | 10-2017-0139457 | 12/2017 | |
| WO | WO-2007083795 A1 * | 7/2007 | B32B 37/12 |
| WO | 2019/009028 | 1/2019 | |

OTHER PUBLICATIONS

Office Action mailed on Sep. 7, 2024 with respect to the corresponding Chinese application No. 202010959801.6.

* cited by examiner

SUBSTRATE FIXING DEVICE AND ELECTROSTATIC CHUCK

CROSS-REFERENCE TO RELATED APPLICATION

This application is based upon and claims priority to Japanese patent application No. 2019-169649, filed on Sep. 18, 2019, the entire contents of which are incorporated herein by reference.

FIELD

A certain aspect of the embodiments discussed herein is related to substrate fixing devices and electrostatic chucks.

BACKGROUND

Film deposition apparatuses (such as CVD apparatuses and PVD apparatuses) and plasma etching apparatuses used for manufacturing semiconductor devices such as ICs and LSIs include a stage for accurately holding a wafer in a vacuum process chamber.

As such a stage, for example, a substrate fixing device that attracts and holds a wafer that is an object of attraction using an electrostatic chuck mounted on a baseplate has been proposed. Examples of substrate fixing devices include a substrate fixing device provided with a gas supply part for cooling a wafer. Gas is supplied to a surface of the electrostatic chuck through, for example, a gas channel inside the baseplate and ceramic porous bodies and through holes provided in the electrostatic chuck. See Japanese Laid-open Patent Publication No. 2015-195346.

SUMMARY

According to an aspect of the present invention, a substrate fixing device includes an electrostatic chuck on a baseplate, and a porous body in a gas hole piercing through a substrate of the electrostatic chuck. The electrostatic chuck attracts an object onto a first surface of the substrate. The gas hole includes a first recess formed in a second surface of the substrate facing the baseplate and depressed toward the first surface, a second recess formed at the bottom of the first recess and depressed toward the first surface, and a through hole extending from the bottom of the second recess to the first surface. The first recess is entirely and the second recess is partly filled with the porous body. A region of the second recess unfilled with the porous body is a recess in the porous body depressed toward the second surface relative to where the bottom of the second recess communicates with the through hole.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
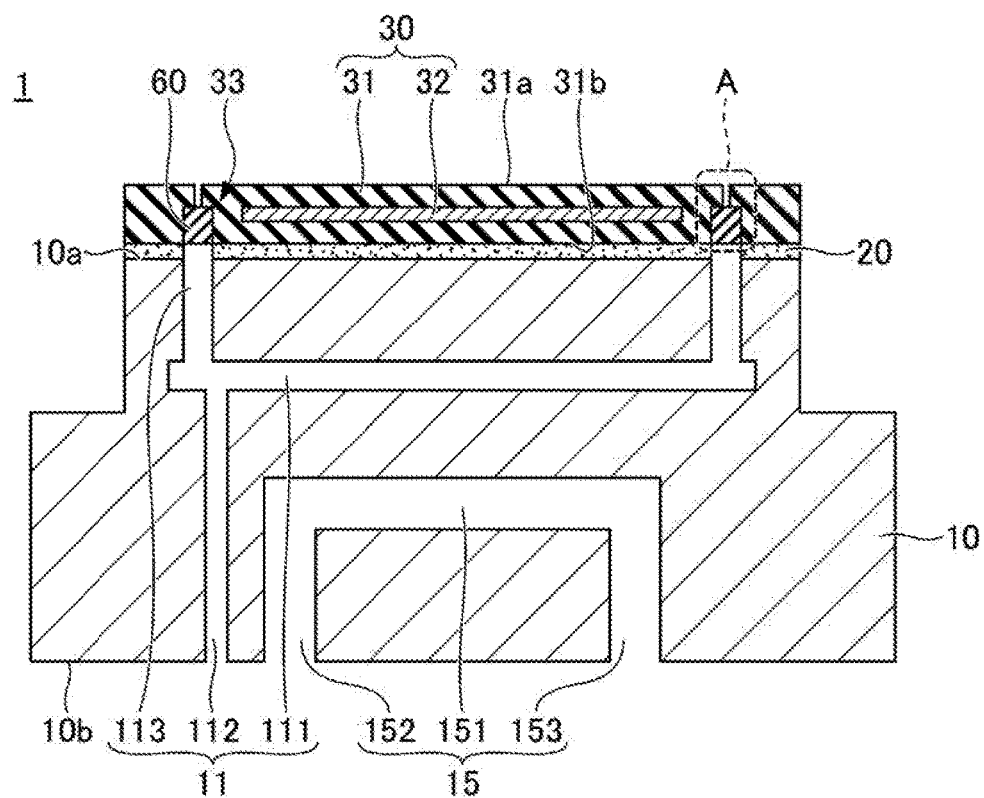
FIGS. 1A and 1B are schematic sectional views of a substrate fixing device according to an embodiment.

In the case of using a substrate fixing device in a plasma etching apparatus, there is a problem in that abnormal discharge occurs in the electrostatic chuck during the etching of a wafer to destroy the wafer and the plasma etching apparatus.

Providing ceramic porous bodies as described above is an effective measure against abnormal discharge. The inventor of the present invention, however, has found that abnormal discharge may occur near the connection of a porous body and a through hole, depending on the structure of the connection.

According to an aspect of the present invention, it is possible to control the occurrence of abnormal discharge in a substrate fixing device.

One or more embodiments of the present invention are explained below with reference to the accompanying drawings. In the following, the same elements or components are referred to using the same reference numeral, and duplicate description thereof may be omitted.

Figure 1B:
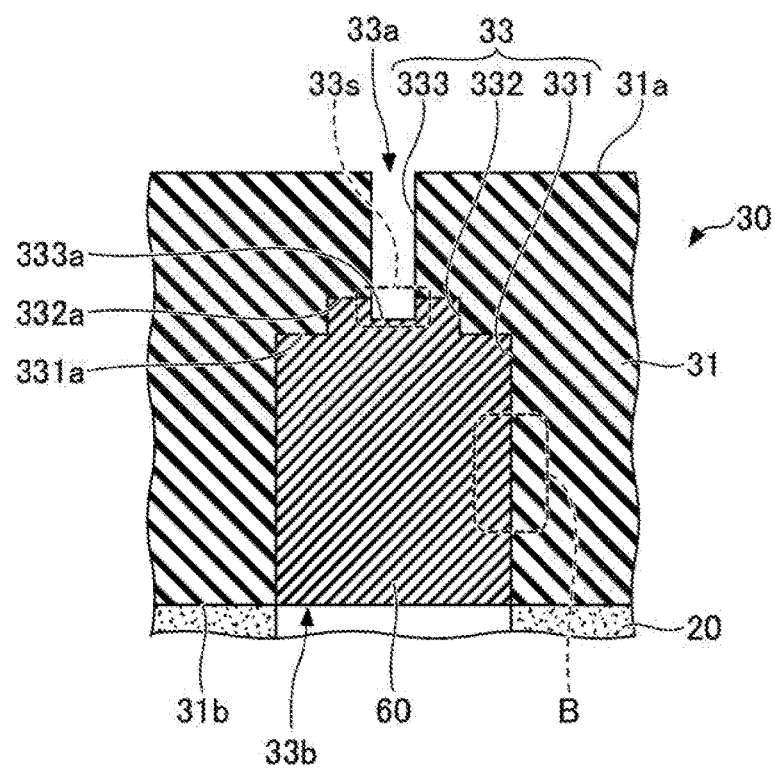

FIG. 1A is a schematic sectional view of a substrate fixing device according to an embodiment in its entirety. FIG. 1B is an enlarged view of part A of FIG. 1A. Referring to FIG. 1A, a substrate fixing device 1 includes a baseplate 10, an adhesive layer 20, and an electrostatic chuck 30.

The baseplate 10 is a member for mounting the electrostatic chuck 30. The thickness of the baseplate 10 is, for example, approximately 20 mm to approximately 40 mm. The baseplate 10 is formed of, for example, aluminum (Al), and may be used as, for example, an electrode for controlling plasma. By feeding the baseplate 10 with predetermined high-frequency electric power, it is possible to control energy for causing, for example, generated ions in the state of plasma to collide with a wafer attracted onto the electrostatic chuck 30 to effectively perform etching.

A gas supply part 11 to supply gas for cooling a wafer attracted and held onto the electrostatic chuck 30 is provided in the baseplate 10. The gas supply part 11 includes a gas channel 111, a gas injection part 112, and gas discharge parts 113.

The gas channel 111 is, for example, a hole annularly formed in the baseplate 10. The gas injection part 112 is a hole having a first end communicating with the gas channel 111 and a second end exposed to the outside at a lower surface 10b of the baseplate 10. The gas injection part 112 introduces an inert gas (such as He or Ar) into the gas channel 111 from outside the substrate fixing device 1. Each of the gas discharge parts 113 is a hole having a first end communicating with the gas channel 111 and a second end exposed to the outside at an upper surface 10a of the baseplate 10. Each gas discharge part 113 communicates with a through hole in the adhesive layer 20 at the second end. The through hole in the adhesive layer 20 may form part of the gas discharge part 113. The gas discharge parts 113 discharge the inert gas introduced into the gas channel 111. In a plan view, the upper surface 10a of the baseplate 10 is dotted with the gas discharge parts 113. The number of the gas discharge parts 113, which may be suitably determined as needed, is approximately a few dozen to approximately a few hundred.

The plan view refers to a view of an object taken in a direction normal to a placement surface 31a of a substrate 31 of the electrostatic chuck 30. A planar shape refers to the shape of an object as viewed in the direction normal to the placement surface 31a of the substrate 31.

A cooling mechanism 15 is provided in the baseplate 10. The cooling mechanism 15 includes a cooling medium channel 151, a cooling medium introduction part 152, and a cooling medium discharge part 153. The cooling medium channel 151 is, for example, a hole annularly formed in the baseplate 10. The cooling medium introduction part 152 is a hole having a first end communicating with the cooling medium channel 151 and a second end exposed to the outside at the lower surface 10b of the baseplate 10. The cooling medium introduction part 152 introduces a cooling medium (such as coolant water or Galden®) into the cooling medium channel 151 from outside the substrate fixing device 1. The cooling medium discharge part 153 is a hole having a first end communicating with the cooling medium channel 151 and a second end exposed to the outside at the lower surface 10b of the baseplate 10. The cooling medium discharge part 153 discharges the cooling medium introduced into the cooling medium channel 151.

The cooling mechanism 15 is connected to a cooling medium controller (not depicted) provided outside the substrate fixing device 1. The cooling medium controller introduces a cooling medium into the cooling medium channel 151 from the cooling medium introduction part 152 and discharges the cooling medium from the cooling medium discharge part 153. By circulating a cooling medium through the cooling mechanism 15 to cool the baseplate 10, a wafer attracted onto the electrostatic chuck 30 can be cooled.

The electrostatic chuck 30 is where a wafer that is an object of attraction is attracted and held. The planar shape of the electrostatic chuck 30 is, for example, a circle. A wafer to be attracted onto the electrostatic chuck 30 is, for example, approximately 8 in., approximately 12 in., or approximately 18 in. in diameter.

The electrostatic chuck 30 is provided on the upper surface 10a of the baseplate 10 through the adhesive layer 20. The adhesive layer 20 is, for example, a silicone adhesive. The thickness of the adhesive layer 20 is, for example, approximately 0.1 mm to approximately 1.0 mm. The adhesive layer 20 bonds the baseplate 10 and the electrostatic chuck 30 together and also achieves a stress reduction effect to reduce stress resulting from a difference in the coefficient of thermal expansion between the ceramic electrostatic chuck 30 and the aluminum baseplate 10.

The electrostatic chuck 30 includes the substrate 31 and an electrostatic electrode 32. The upper surface of the substrate 31 is the placement surface 31a for placing an object of attraction. The electrostatic chuck 30 is, for example, a Johnsen-Rahbek electrostatic chuck. The electrostatic chuck 30 may alternatively be a Coulombic electrostatic chuck.

The substrate 31 is a dielectric. Suitable materials for the substrate 31 include, for example, ceramics such as aluminum oxide ($Al_2O_3$) and aluminum nitride (AlN). The substrate 31 may include, for example, oxides of two or more elements selected from silicon (Si), magnesium (Mg), calcium (Ca), aluminum, and yttrium (Y) as an auxiliary agent. The thickness of the substrate 31 is, for example, approximately 5 mm to approximately 10 mm. The relative permittivity (at 1 kHz) of the substrate 31 is, for example, approximately 9 to approximately 10.

The electrostatic electrode 32 is a thin-film electrode buried in the substrate 31. The electrostatic electrode 32 is connected to a power supply provided outside the substrate fixing device 1. When a predetermined voltage is applied from the power supply to the electrostatic electrode 32, an electrostatic attraction force is generated between the electrostatic electrode 32 and a wafer. As a result, the wafer can be attracted and held onto the placement surface 31a of the substrate 31 of the electrostatic chuck 30. The attraction and holding force increases as the voltage applied to the electrostatic electrode 32 increases. The electrostatic electrode 32 may have either a monopolar electrode or a bipolar electrode. Suitable materials for the electrostatic electrode 32 include, for example, tungsten (W) and molybdenum (Mo).

A heating element that generates heat in response to receiving voltage applied from outside the substrate fixing device 1 to heat the placement surface 31a of the substrate 31 to a predetermined temperature may be provided in the substrate 31.

Gas holes 33 are provided in the substrate 31 at positions corresponding to the gas discharge parts 113. The gas holes 33 pierce through the substrate 31 to expose (connect to) the second ends of the gas discharge parts 113. Gas is supplied from the gas supply part 11 to the placement surface 31a through the gas holes 33.

Referring to FIG. 1B, each gas hole 33 includes a first recess 331, a second recess 332, and a through hole 333. The first recess 331 is depressed toward the placement surface 31a relative to a lower surface 31b of the substrate 31 facing the baseplate 10, which is on the opposite side of the substrate 31 (namely, faces away) from the placement surface 31a (upper surface). The second recess 332 is depressed toward the placement surface 31a relative to a bottom surface 331a (a first step surface) of the first recess 331. The through hole 333 pierces through the substrate 31 from a bottom surface 332a (a second step surface) of the second recess 332 to the placement surface 31a. That is, the lower surface 31b of the substrate 31 is depressed toward the placement surface 31a to form the gas hole 33, which is a stepped through hole including a first hole extending from the lower surface 31b toward the placement surface 31a, a second hole extending from the bottom end of the first hole toward the placement surface 31a, and the through hole 333 extending from the bottom end of the second hole to the placement surface 31a. The first recess 331, the second recess 332, and the through hole 333 are, for example, coaxially formed and communicate with each other. In the plan view, the second recess 332 is smaller than the first recess 331, and the through hole 333 is smaller than the second recess 332. The second recess 332, however, may be equal in size to the first recess 331 or the through hole 333. Thus, the gas hole 33 has a first opening 33a at the placement surface 31a and a second opening 33b at the lower surface 31b. The gas hole 33 has a stepped tapering shape narrowing toward the first opening 33a and forms the first step surface and the second step surface closer to the placement surface 31a than the first step surface in the substrate 31.

The planar shape of the first recess 331, the second recess 332, and the through hole 333 is, for example, a circle. In this case, the inside diameter of the second recess 332 is smaller than the inside diameter of the first recess 331, and the inside diameter of the through hole 333 is smaller than the inside diameter of the second recess 332. The inside diameter of the first recess 331 is, for example, approximately 1 mm to approximately 5 mm. The inside diameter of the second recess 332 is, for example, approximately 0.8 mm to approximately 4.8 mm. The inside diameter of the through hole 333 is, for example, approximately 0.6 mm to approximately 3.2 mm. An example combination of the inside diameters of the first recess 331, the second recess 332, and the through hole 333 is 2 mm for the first recess 331, 0.8 mm for the second recess 332, and 0.6 mm for the through hole 333. Hereinafter, an example of the case where the planar shape of the first recess 331, the second recess 332, and the through hole 333 is a circle is described.

The depth of the first recess 331 is, for example, approximately 4 mm to approximately 8 mm. The depth of the second recess 332 is, for example, approximately 50 μm to approximately 500 μm. The depth of the through hole 333 is, for example, approximately 1.3 mm to approximately 1.7 mm.

The entire internal region of the first recess 331 and an internal region of the second recess 332 except for an unfilled region 33s are filled with a porous body 60. The unfilled region 33s and the through hole 333 are not filled with the porous body 60. That is, the porous body 60 is absent in the unfilled region 33s and the through hole 333. The unfilled region 33s is a recess depressed toward the lower surface 31b of the substrate 31 relative to a position where the bottom surface 332a of the second recess 332 communicates with (connects to) the through hole 333. The unfilled region 33s is a space communicating with the through hole 333. The planar shape of the unfilled region 33s is a circle, and the inside diameter of the unfilled region 33s is substantially equal to the inside diameter of the through hole 333. The unfilled region 33s does not extend into the first recess 331. That is, when measured in a direction toward the lower surface 31b of the substrate 31, the depth of the unfilled region 33s is smaller than the depth of the second recess 332. The unfilled region 33s may have any depth as long as the unfilled region 33s is shallower than the second recess 332.

While the through hole 333 and the unfilled region 33s form a single continuous space (hole), here, a portion of the space on the placement surface 31a side of the bottom surface 332a of the second recess 332 is referred to as the "through hole 333" and a portion of the space on the first recess 331 side of the bottom surface 332a of the second recess 332 is referred to as the "unfilled region 33s" for convenience.

Figure 2:
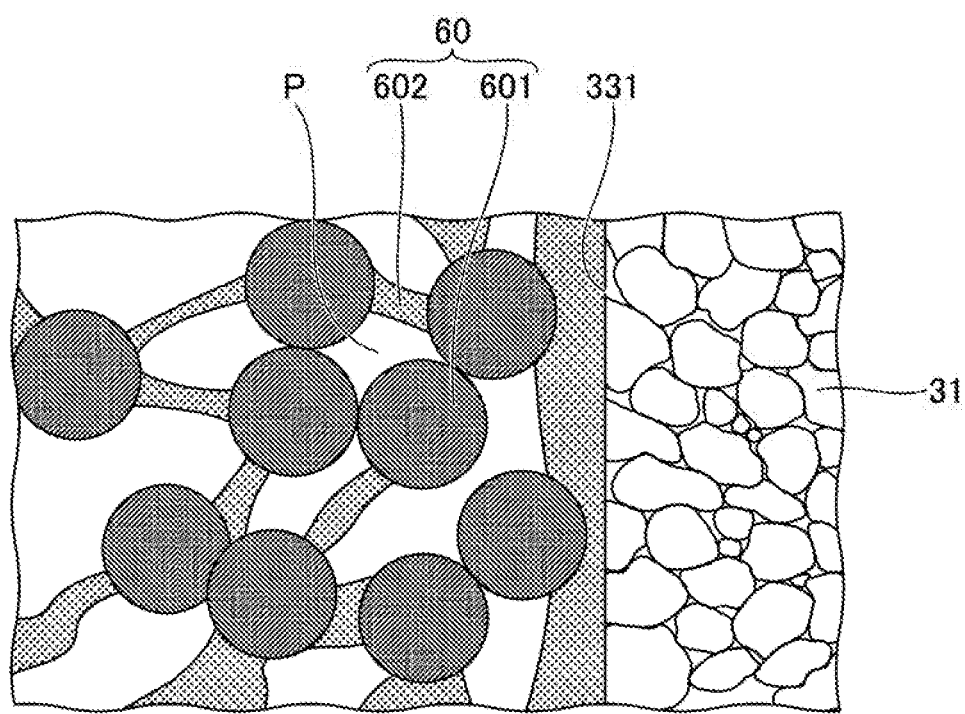
FIG. 2 is a diagram illustrating a porous body.

Referring to FIG. 2, the porous body 60 includes multiple spherical oxide ceramic particles 601 and an oxide mixture 602 that bonds the spherical oxide ceramic particles 601 into a one-piece structure.

The spherical oxide ceramic particles 601 range from 30 μm to 1000 μm in diameter, for example. Suitable examples of the spherical oxide ceramic particles 601 include spherical aluminum oxide particles. The spherical oxide ceramic particles 601 are preferably contained in the porous body 60 at a ratio by weight of 80 wt % or more (and 97 wt % or less).

The oxide mixture 602 supports the spherical oxide ceramic particles 601 by adhering to part of their exterior surfaces (spherical surfaces). For example, the oxide mixture 602 is constituted of oxides of two or more elements selected from silicon, magnesium, calcium, aluminum, and yttrium.

Pores P are formed in the porous body 60. The pores P communicate with the outside so that gas can pass through the porous body 60 from its bottom to top. The porosity of the pores P famed in the porous body 60 preferably ranges from 20% to 50% of the volume of the entirety of the porous body 60. Part of the exterior surfaces of the spherical oxide ceramic particles 601 and the oxide mixture 602 are exposed in the pores P.

When formed of aluminum oxide, the substrate 31 preferably includes oxides of two or more elements selected from silicon, magnesium, calcium, and yttrium as other components. The composition ratio of the oxides of two or more elements selected from silicon, magnesium, calcium, and yttrium in the substrate 31 is preferably equal to the composition ratio of the oxides of two or more elements selected from silicon, magnesium, calcium, and yttrium in the oxide mixture 602 of the porous body 60.

By thus causing the substrate 31 and the oxide mixture 602 of the porous body 60 to have the same oxide composition ratio, the porous body 60 is sintered without mass transfer between the substrate 31 and the porous body 60, so that the planarity of the interface between the substrate 31 and the porous body 60 can be ensured.

FIGS. 3A through 3E are diagrams illustrating a process of manufacturing a substrate fixing device according to the embodiment. FIGS. 3A through 3E illustrate a section corresponding to FIG. 1B. Here, a description is given, focusing on the process of forming the gas holes 33 in the electrostatic chuck 30, with reference to FIGS. 3A through 3E.

First, the substrate 31 including the electrostatic electrode 32 is formed according to a known manufacturing method that includes the process of forming a via in a green sheet, the process of filling the via with conductive paste, the process of forming a pattern to become an electrostatic electrode, the process of stacking another green sheet on the green sheet and performing firing, and the process of performing surface planarization.

Figure 3A:
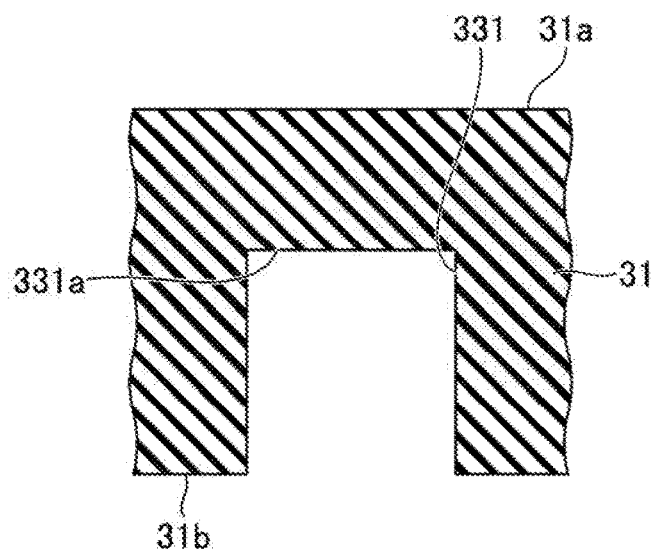
FIGS. 3A through 3E are diagrams illustrating a process of manufacturing a substrate fixing device according to the embodiment.

Next, as illustrated in FIG. 3A, the first recess 331 depressed toward the placement surface 31a relative to the lower surface 31b of the substrate 31 is formed. As described above, the first recess 331 is, for example, circular in planar shape, approximately 1 mm to approximately 5 mm in inside diameter, and approximately 4 mm to approximately 8 mm in depth. As many first recesses 331 as the gas discharge parts 113 are formed in the baseplate 10 at positions corresponding to the gas discharge parts 113 by, for example, drilling.

Figure 3B:
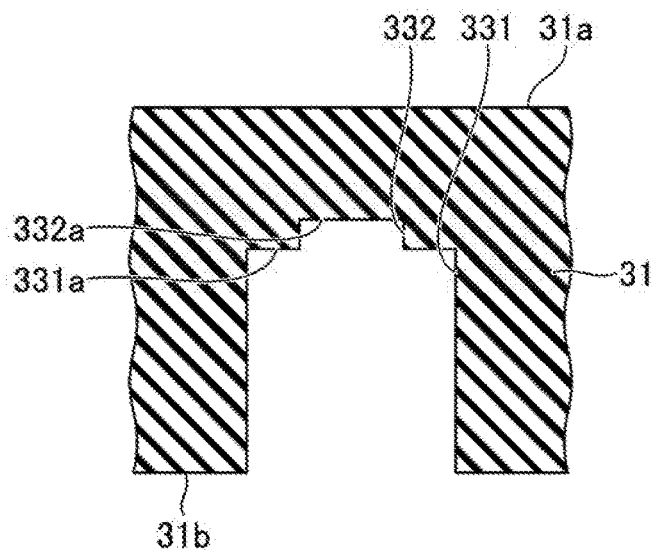

Next, as illustrated in FIG. 3B, the second recess 332 depressed toward the placement surface 31a relative to the bottom surface 331a of the first recess 331 is formed. As described above, the second recess 332, for example, has a planar shape of a circle smaller in diameter than the first recess 331 and is approximately 0.8 mm to approximately 4.8 mm in inside diameter and approximately 50 μm to approximately 500 μm in depth. The second recess 332 is formed coaxially with the first recess 331 by, for example, drilling.

Figure 3C:
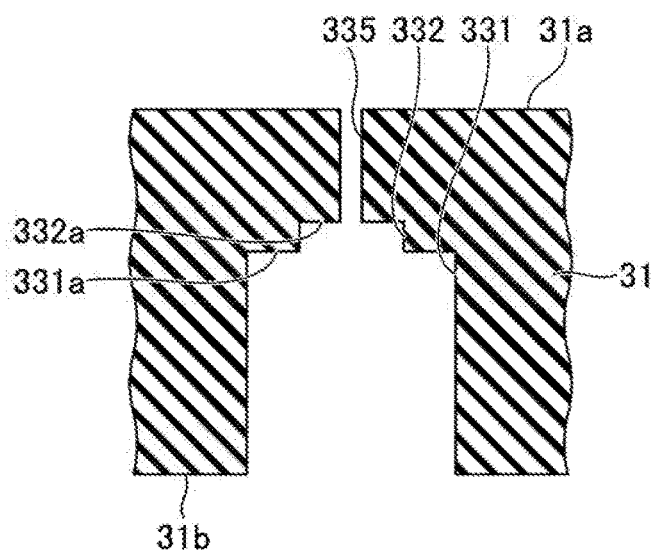

Next, as illustrated in FIG. 3C, a through hole 335 piercing through the substrate 31 from the bottom surface 332a of the second recess 332 to the placement surface 31a is formed. The through hole 335, for example, has a planar shape of a circle smaller in diameter than the through hole 333 (see FIG. 1B) and is approximately 0.3 mm to approximately 1.6 mm in inside diameter and approximately 1.3 mm to approximately 1.7 mm in depth. The through hole 335 is formed coaxially with the first recess 331 and the second recess 332 by, for example, drilling. The process illustrated in FIG. 3B and the process illustrated in FIG. 3C may be in reverse order.

Figure 3D:
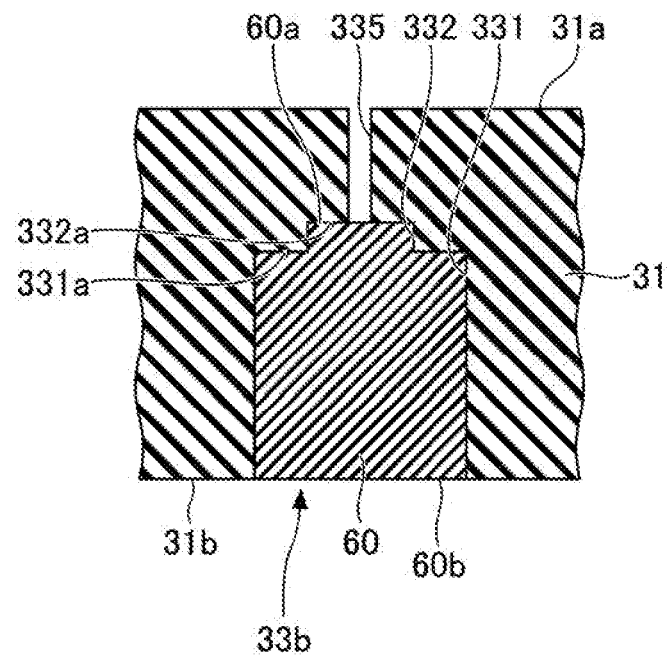

Next, as illustrated in FIG. 3D, the porous body 60 is formed in the first recess 331 and the second recess 332. That is, the porous body 60 is embedded in the substrate 31 from the second opening 33b up to the bottom surface 332a, so that an upper end surface 60a of the porous body is in direct contact with the bottom surface 332a. The porous body 60 may be formed by filling the first recess 331 and the second recess 332 with paste serving as a precursor to the porous body 60 using a squeegee or the like and sintering the paste. If part of the porous body 60 protrudes relative to the lower surface 31b of the substrate 31, a lower end face 60b of the porous body 60 is, for example, ground to be substantially flush with the lower surface 31b of the substrate 31. Here, the through hole 335 is necessary as an air outlet while filling the first recess 331 and the second recess 332 with the paste serving as a precursor to the porous body 60, and serves to facilitate paste filling. While part of the porous body 60 may enter the through hole 335, the paste flows out if the through hole 335 is large in inside diameter. Therefore, preferably, the through hole 335 is suitably small in inside diameter.

The paste serving as a precursor to the porous body 60, for example, contains spherical aluminum oxide particles at a predetermined ratio by weight. The rest of the paste includes, for example, oxides of two or more elements selected from silicon, magnesium, calcium, aluminum, and yttrium, and further includes an organic binder and a solvent. Examples of organic binders include polyvinyl butyral. Examples of solvents include alcohol.

Next, the baseplate 10 in which the cooling mechanism 15, etc., are formed in advance is prepared, and the adhesive layer (uncured) is formed on the baseplate 10. Then, the structure as illustrated in FIG. 3D is placed on the baseplate 10 through the adhesive layer 20, and the adhesive layer 20 is cured.

Figure 3E:
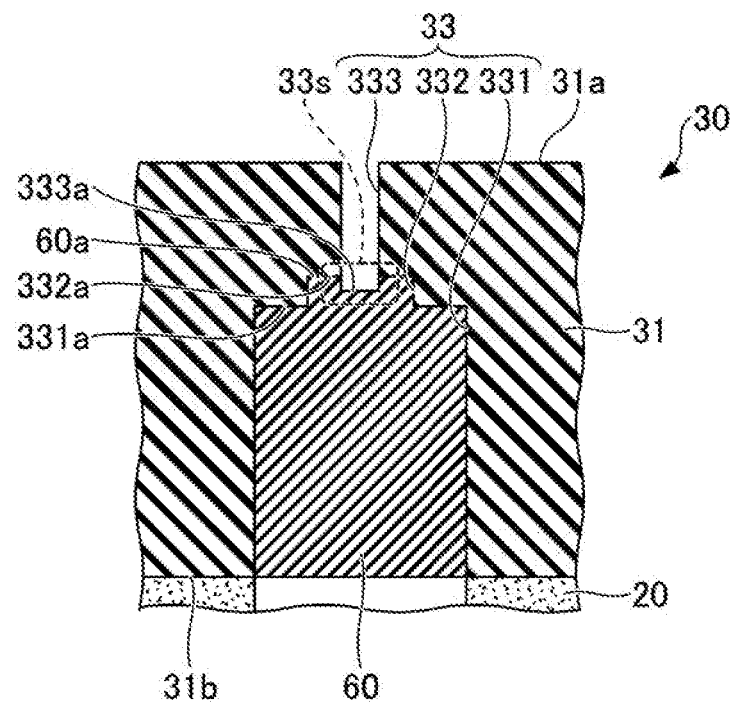

Next, as illustrated in FIG. 3E, the through hole 333 larger in diameter than the through hole 335 is formed at a position where the through hole 335 is formed. By forming the through hole 333 by enlarging the opening of the through hole 335, the flow rate of gas supplied from the baseplate 10 side to the placement surface 31a side increases to improve wafer temperature controllability, compared with the case of not forming the through hole 333.

The through hole 333, for example, has a planar shape of a circle larger in diameter than the through hole 335 and smaller in diameter than the second recess 332 and is approximately 0.6 mm to approximately 3.2 mm in inside diameter and approximately 1.3 mm to approximately 1.7 mm in depth. The through hole 333 is formed coaxially with the first recess 331 and the second recess 332 by, for example, drilling.

The through hole 333 (including the unfilled region 33s) is so formed as to extend into the second recess 332. That is, the upper end surface 60a of the porous body 60 is depressed so that a bottom 333a (the depressed part of the upper end surface 60a defining the bottom) of the through hole 333 is positioned between the bottom surface 332a of the second recess 332 and the bottom surface 331a of the first recess 331 in the thickness direction of the substrate 31. As a result, the unfilled region 33s, which is a recess depressed toward the lower surface 31b of the substrate 31 relative to the position where the bottom surface 332a of the second recess 332 communicates with the through hole 333 and is a space communicating with the through hole 333, is formed.

As long as the bottom 333a of the through hole 333 is positioned within the second recess 332, the bottom 333a does not have to be a flat surface and may be, for example, a tapered surface with a depression narrowing toward the bottom surface 331a of the first recess 331 in accordance with the shape of the tip of a drill.

Through the above-described process, the substrate fixing device 1 as illustrated in FIGS. 1A and 1B is completed.

Figure 4A:
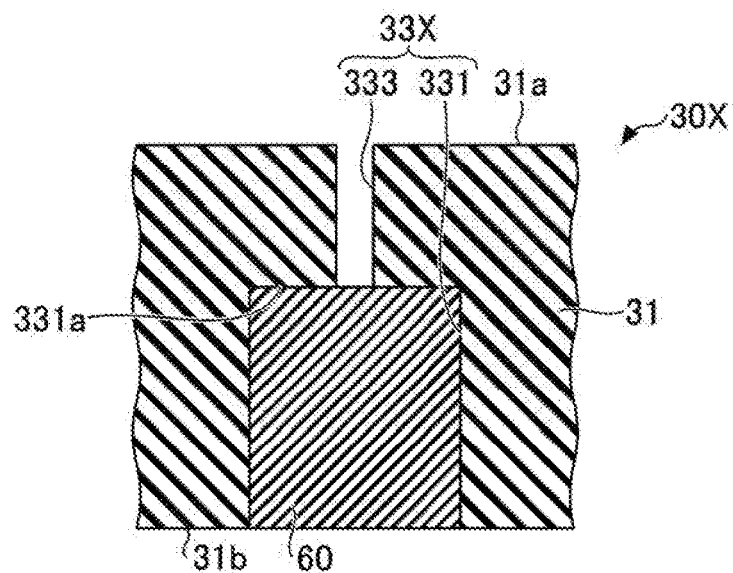
FIGS. 4A through 4C are diagrams illustrating an electrostatic chuck of a substrate fixing device according to a comparative example.
Figure 4B:
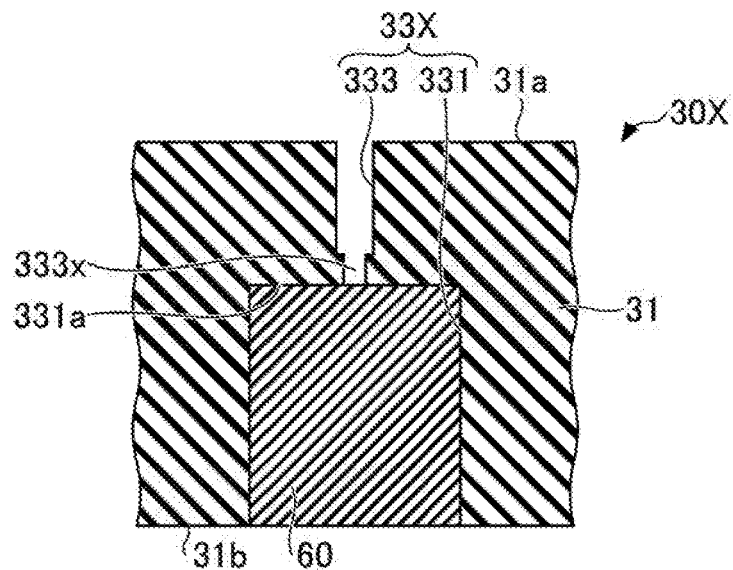
Figure 4C:
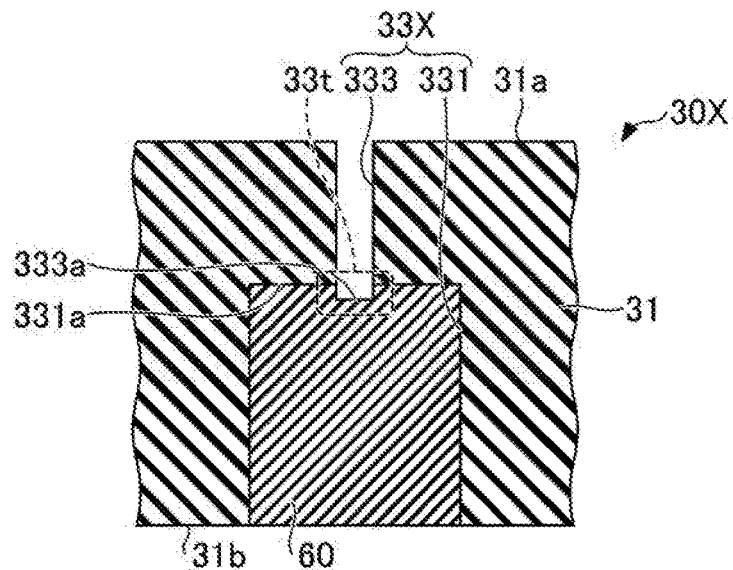

Here, an effect produced by the substrate fixing device 1 is described also with reference to a comparative example. FIGS. 4A through 4C are diagrams illustrating an electrostatic chuck 30X of a substrate fixing device 1X according to the comparative example. The electrostatic chuck 30X is different from the electrostatic chuck 30 of the substrate fixing device 1 (see, for example, FIGS. 1A and 1B) in that the gas holes 33 are replaced with gas holes 33X.

Referring to FIGS. 4A through 4C, the gas hole 33X of the substrate fixing device 1X does not have the second recess 332. The gas hole 33X is composed of the first recess 331 and the through hole 333 piercing through the substrate 31 from the bottom surface 331a of the first recess 331 to the placement surface 31a. The first recess 331 and the through hole 333, for example, are coaxially provided and communicate with each other. In the plan view, the through hole 333 is smaller in size than the first recess 331. Each of the first recess 331 and the through hole 333 has the same dimension range as in the case of the substrate fixing device 1.

The substrate fixing device 1X may be manufactured by performing the processes illustrated in FIGS. 3A and 3C through 3E.

FIGS. 4A through 4C illustrate the three possible states of the electrostatic chuck 30X due to manufacturing variations. FIG. 4A illustrates the ideal state of the electrostatic chuck 30X, where the entire region inside the first recess 331 is filled with the porous body 60 and the inside diameter of the through hole 333 is constant.

In contrast, in the state illustrated in FIG. 4B, while the entire region inside the first recess 331 is filled with the porous body 60, the inside diameter of the through hole 333 is not constant. Specifically, the through hole 333 is reduced in inside diameter to have a small diameter part 333x where the through hole 333 connects to the first recess 331.

Figure 5A:
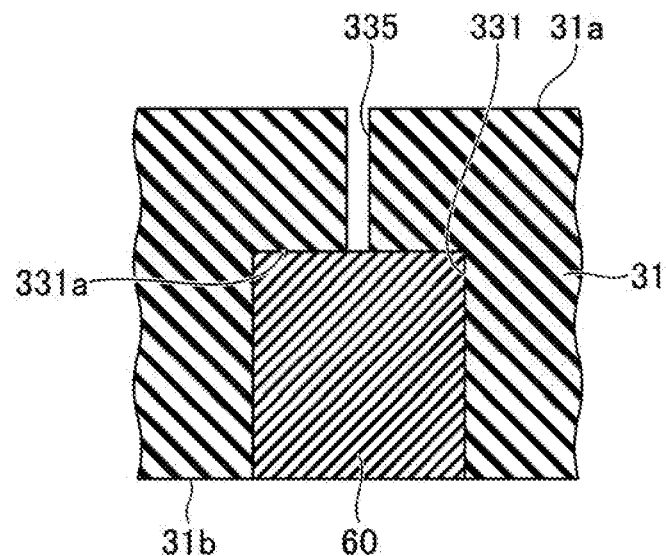
FIGS. 5A and 5B are diagrams illustrating a process of manufacturing the substrate fixing device according to the comparative example.
Figure 5B:
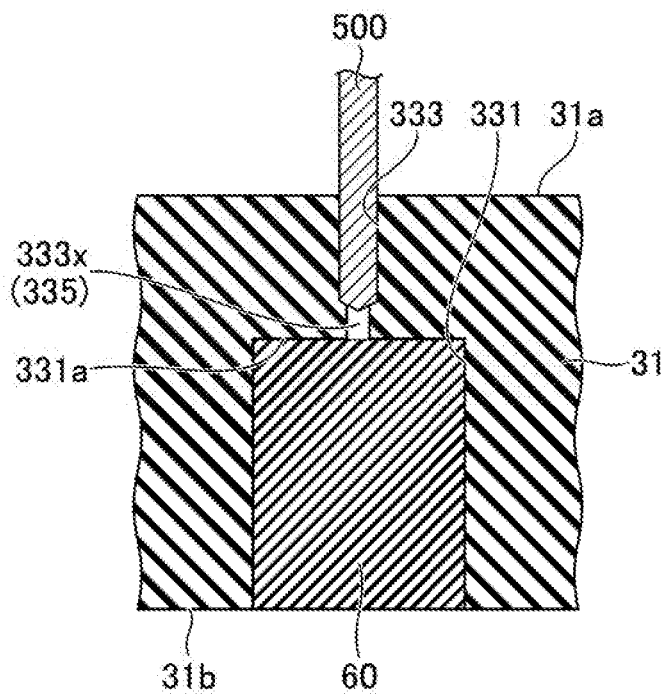

The small diameter part 333x results from the process illustrated in FIGS. 5A and 5B. The process of FIGS. 5A and 5B corresponds to the process of FIGS. 3D and 3E of the substrate fixing device 1. In the process of FIG. 5A, the first recess 331 is filled with the porous body 60. In the process of FIG. 5B, the through hole 333 is formed by drilling. Because of manufacturing variations, however, the tip of a drill 500 fails to reach the bottom surface 331a of the first recess 331, so that an end portion of the through hole 335 connecting to the first recess 331 is not processed and remains as the small diameter part 333x. That is, the small diameter part 333x has the same inside diameter as the through hole 335 of the process of FIG. 5A.

Formation of the small diameter part 333x, which reduces the flow rate of gas supplied from the baseplate 10 side to the placement surface 31a side, is not preferable because the wafer cooling ability is degraded. Therefore, in the actual manufacturing process, it is necessary to lower the tip of the drill 500 for more than a design value, allowing a sufficient margin, in order to avoid formation of the small diameter part 333x. Therefore, as illustrated in FIG. 4C, although the small diameter part 333x is not formed, an unfilled region 33t not filled with the porous body 60 is formed in the first recess 331.

The unfilled region 33t is a recess depressed toward the lower surface 31b of the substrate 31 relative to a position where the bottom surface 331a of the first recess 331 communicates with the through hole 333, and is a space communicating with the through hole 333. The planar shape of the unfilled region 33t is a circle, and the inside diameter of the unfilled region 33t is substantially equal to the inside diameter of the through hole 333.

In the process of FIG. 5B, the tip of the drill 500 reaches a position beyond the bottom surface 331a of the first recess 331 to remove part of the porous body 60 to form a space that is the unfilled region 33t. When a space is formed in part of the first recess 331, abnormal discharge may occur around the space, as has been found by the inventor of the present invention.

Thus, when the tip of the drill 500 is lowered for more than a design value, allowing a sufficient margin, in order to avoid formation of the small diameter part 333x in the process of FIG. 5B, the gas hole 33X has the shape as illustrated in FIG. 4C, so that abnormal discharge may occur. When the shape of the gas hole 33X is in the ideal state illustrated in FIG. 4A, problems such as reduction in the flow rate of gas and abnormal discharge do not occur.

In contrast, according to the substrate fixing device 1 of this embodiment, the second recess 332 is disposed between the first recess 331 and the through hole 333. Therefore, as long as the second recess 332 is deeper than the controllable range of the tip position of the drill 500, the unfilled region 33s always stays within the second recess 332 without entering the first recess 331 even when the tip of the drill 500 varies in position.

When the central portion of the tip of the drill 500 has a pointed shape, normally, the amount of protrusion is 50 μm or less. Therefore, when it is possible to control the tip position of the drill 500 with extremely high accuracy, the depth of the second recess 332 may be 50 μm. On the other hand, to manage the manufacturing process, preferably, the depth of the second recess 332 is so determined as to prevent the tip of the drill 500 from entering the first recess 331 even when the tip of the drill 500 varies in position, and in this case, the depth of the second recess 332 may be at most 500 μm. That is, the depth of the second recess 332 is preferably more than or equal to 50 μm and less than or equal to 500 μm.

According to studies by the inventor, abnormal discharge may occur when the unfilled region 33s enters the first recess 331, but no abnormal discharge occurs when the unfilled region 33s stays within the second recess 332. That is, according to the substrate fixing device 1 where the unfilled region 33s does not reach the first recess 331 and the entire region inside the first recess 331 is filled with the porous body 60, it is possible to control the occurrence of abnormal discharge compared with conventional substrate fixing devices such as the one illustrated in the comparative example.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that various changes, substitutions, and alterations could be made hereto without departing from the spirit and scope of the invention.

For example, examples of objects to be attracted and held by a substrate fixing device according to embodiments of the present invention include, in addition to semiconductor wafers (such as silicon wafers), glass substrates used in the process of manufacturing, for example, liquid crystal panels.

What is claimed is:

1. A substrate fixing device comprising:
   a baseplate including a gas supply part;
   an electrostatic chuck on the baseplate, the electrostatic chuck including a substrate and configured to attract an object onto a first surface of the substrate, the substrate having a gas hole extending from a second surface of the substrate to the first surface, the second surface facing the baseplate, so that gas is supplied from the gas supply part to the first surface; and
   a porous body in the gas hole,
   wherein the gas hole includes
      a first recess formed in the second surface and depressed toward the first surface;
      a second recess formed at a bottom of the first recess and depressed toward the first surface; and
      a through hole piercing through the substrate from a bottom of the second recess to the first surface,
   an entirety of the first recess is filled with the porous body, the second recess is partly filled with the porous body, and a region of the second recess unfilled with the porous body is a recess in the porous body and a space communicating with the through hole, the recess being depressed toward the second surface relative to a position where the bottom of the second recess communicates with the through hole, and
   the gas supply part communicates with the gas hole to discharge the gas directly to the gas hole.

2. The substrate fixing device as claimed in claim 1, wherein a size of the second recess is smaller than a size of the first recess and a size of the through hole is smaller than the size of the second recess in a plan view.

3. The substrate fixing device as claimed in claim 1, wherein a depth of the second recess is 50 μm or more and 500 μm or less.

4. The substrate fixing device as claimed in claim 1, wherein
   the porous body includes a plurality of pores communicating with each other, and
   the gas is supplied through the plurality of pores.

5. The substrate fixing device as claimed in claim 1, wherein the substrate and the porous body include a same oxide ceramic.

6. The substrate fixing device as claimed in claim 5, wherein the oxide ceramic is aluminum oxide.

7. The substrate fixing device as claimed in claim 1, wherein
   the substrate includes a plurality of first oxides whose respective elements are different,
   the porous body includes a plurality of second oxides whose respective elements are different,
   the elements of the first oxides are the same as the elements of the second oxides, and
   a composition ratio of the first oxides in the substrate is equal to a composition ratio of the second oxides in the porous body.

8. The substrate fixing device as claimed in claim 7, wherein the elements are selected from the group consisting of silicon, magnesium, calcium, and yttrium.

9. The substrate fixing device as claimed in claim 1, wherein a bottom of the recess in the porous body is positioned between the bottom of the first recess and the bottom of the second recess in a thickness direction of the substrate.

10. A substrate fixing device comprising:

a baseplate including a gas supply part; and an electrostatic chuck on the baseplate, the electrostatic chuck including a substrate having a first surface onto which an object is to be attracted and a second surface facing away from the first surface, the substrate including a through hole having a first opening at the first surface and a second opening at the second surface, the through hole having a stepped tapering shape narrowing toward the first opening and forming a first step surface and a second step surface in the substrate, the second step surface being closer to the first surface than the first step surface; and a porous body embedded in the substrate from the second opening up to the second step surface, wherein an end surface of the porous body in direct contact with the second step surface includes a depression toward the second opening, wherein the gas supply part communicates with the second opening of the through hole to discharge gas directly to the through hole, and the discharged gas is supplied to the first surface through the through hole in which the porous body is provided.

11. The substrate fixing device as claimed in claim 10, wherein the substrate includes a plurality of first oxides whose respective elements are different, the porous body includes a plurality of second oxides whose respective elements are different, the elements of the first oxides are the same as the elements of the second oxides, and a composition ratio of the first oxides in the substrate is equal to a composition ratio of the second oxides in the porous body.

12. The substrate fixing device as claimed in claim 11, wherein the elements are selected from the group consisting of silicon, magnesium, calcium, and yttrium.

13. The substrate fixing device as claimed in claim 10, wherein a bottom of the depression is positioned between the first step surface and the second step surface in a thickness direction of the substrate.

14. The substrate fixing device as claimed in claim 10, wherein the depression is exposed to an outside of the electrostatic chuck through the first opening.

15. The substrate fixing device as claimed in claim 10, wherein the first step surface and the second step surface face toward the second opening.

16. The substrate fixing device as claimed in claim 10, wherein the electrostatic chuck further includes an electrostatic electrode buried in the substrate.

* * * * *